(12) United States Patent
Fish

(10) Patent No.: US 8,536,816 B2
(45) Date of Patent: Sep. 17, 2013

(54) METHOD AND SYSTEM FOR DETECTING FAULTS IN A BRUSHLESS EXCITER

(75) Inventor: William Earl Fish, Amsterdam, NY (US)

(73) Assignee: General Electric Company, Schenectady, NY (US)

( * ) Notice: Subject to any disclaimer, the term of this patent is extended or adjusted under 35 U.S.C. 154(b) by 266 days.

(21) Appl. No.: 13/229,962

(22) Filed: Sep. 12, 2011

(65) Prior Publication Data

US 2013/0063066 A1 Mar. 14, 2013

(51) Int. Cl.
*H02K 11/00* (2006.01)

(52) U.S. Cl.
CPC .................................. *H02K 11/001* (2013.01)
USPC ........... 318/490; 318/721; 318/701; 318/727; 318/811

(58) Field of Classification Search
CPC ..................................................... H02K 11/001
USPC .......................... 318/490, 721, 701, 727, 811
See application file for complete search history.

(56) References Cited

U.S. PATENT DOCUMENTS

| | | | |
|---|---|---|---|
| 5,214,410 A | 5/1993 | Verster | |
| 6,232,870 B1 | 5/2001 | Garber et al. | |
| 6,693,778 B1 * | 2/2004 | Pittman et al. | 361/42 |
| 7,405,663 B2 | 7/2008 | Lieffort et al. | |
| 7,555,411 B2 * | 6/2009 | Wang et al. | 702/188 |
| 7,633,259 B2 | 12/2009 | Fish | |
| 2009/0296777 A1 | 12/2009 | Fish | |

FOREIGN PATENT DOCUMENTS

| | | |
|---|---|---|
| GB | 2460515 A | 12/2009 |
| GB | 2481101 A | 12/2011 |

OTHER PUBLICATIONS

Search Report from corresponding GB Application No. 1216139.4, dated Dec. 18, 2012.

* cited by examiner

*Primary Examiner* — Bentsu Ro
*Assistant Examiner* — David Luo
(74) *Attorney, Agent, or Firm* — James W. Pemrick; Ernest G. Cusick; Frank A. Landgraff

(57) ABSTRACT

A method of operating an electrical machine is provided. The method includes the steps of providing a brushless excitation system including a diode rectifier having at least one diode, sensing heat energy generated by at least one resistor connected in parallel with the at least one diode, wirelessly transmitting a signal representative of the heat energy, detecting a deviation of generated heat energy from the at least one resistor, and generating a signal indicating an error if the deviation in generated heat energy exceeds a predetermined threshold.

20 Claims, 3 Drawing Sheets

METHOD AND SYSTEM FOR DETECTING FAULTS IN A BRUSHLESS EXCITER

BACKGROUND OF THE INVENTION

The present invention relates to a method and system for detecting faults in a brushless exciter and, particularly, relates to a wireless temperature sensing diode fault detector for a brushless exciter.

A brushless excitation system (or more simply a "brushless exciter") applies a direct current (DC) to the field coils of a rotor in an electrical machine. The current in the generator rotor field coils generates an electromagnetic field that induces current in, for example, the coils of a stator surrounding the generator rotor and in a generator producing AC current. Alternatively, the electromagnetic field from the rotor field coils may be used to turn the rotor of a motor.

Typically, a brushless excitation system is mounted on and rotates with the rotor of the electrical machine. The brushless excitation system includes a rotating armature and a diode rectifier, which may be configured as a diode wheel. Alternating current (AC) generated within the brushless exciter rotating armature is converted by the rotating diode rectifier to direct current, which is applied to the field windings of the generator rotor.

A fault in a diode of the rectifier can impair the conversion of AC to DC by the rectifier. A diode rectifier typically has two or more redundant diodes connected in series for each phase of the AC power applied to the input to the rectifier. It is generally difficult to reliably detect a fault in one diode, due to the presence of redundant diodes. The failure of a single diode may not substantially reduce the ability of the rectifier to convert AC to DC power. The failure of two or more diodes in series can impair the conversion of AC to DC, lead to a failure of the rectifier and result in an unscheduled shutdown of the electrical machine.

BRIEF DESCRIPTION OF THE INVENTION

According to one aspect of the present invention, a method of operating an electrical machine is provided. The method includes the steps of providing a brushless excitation system including a diode rectifier having at least one diode, sensing heat energy generated by at least one resistor connected in parallel with the at least one diode, wirelessly transmitting a signal representative of the heat energy, detecting a deviation of generated heat energy from the at least one resistor, and generating a signal indicating an error if the deviation in generated heat energy exceeds a predetermined threshold.

According to another aspect of the present invention, a brushless excitation system for an electrical machine is provided. The system includes a diode rectifier configured to be electrically coupled to a source of alternating current. The diode rectifier has a plurality of diodes configured to produce direct current applied to field windings of a rotor of the electrical machine. A plurality of resistors includes a resistor connected in parallel with a diode in the diode rectifier. A plurality of wireless temperature sensors are proximate to the plurality of resistors, wherein one wireless temperature sensor of the plurality of wireless temperature sensors is configured to sense temperature from one resistor in the plurality of resistors. A controller receives temperature data indicative of temperature signals from the plurality of resistors, and the controller detects whether one or more diodes in the diode rectifier is faulty based on the temperature data.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Figure 1:
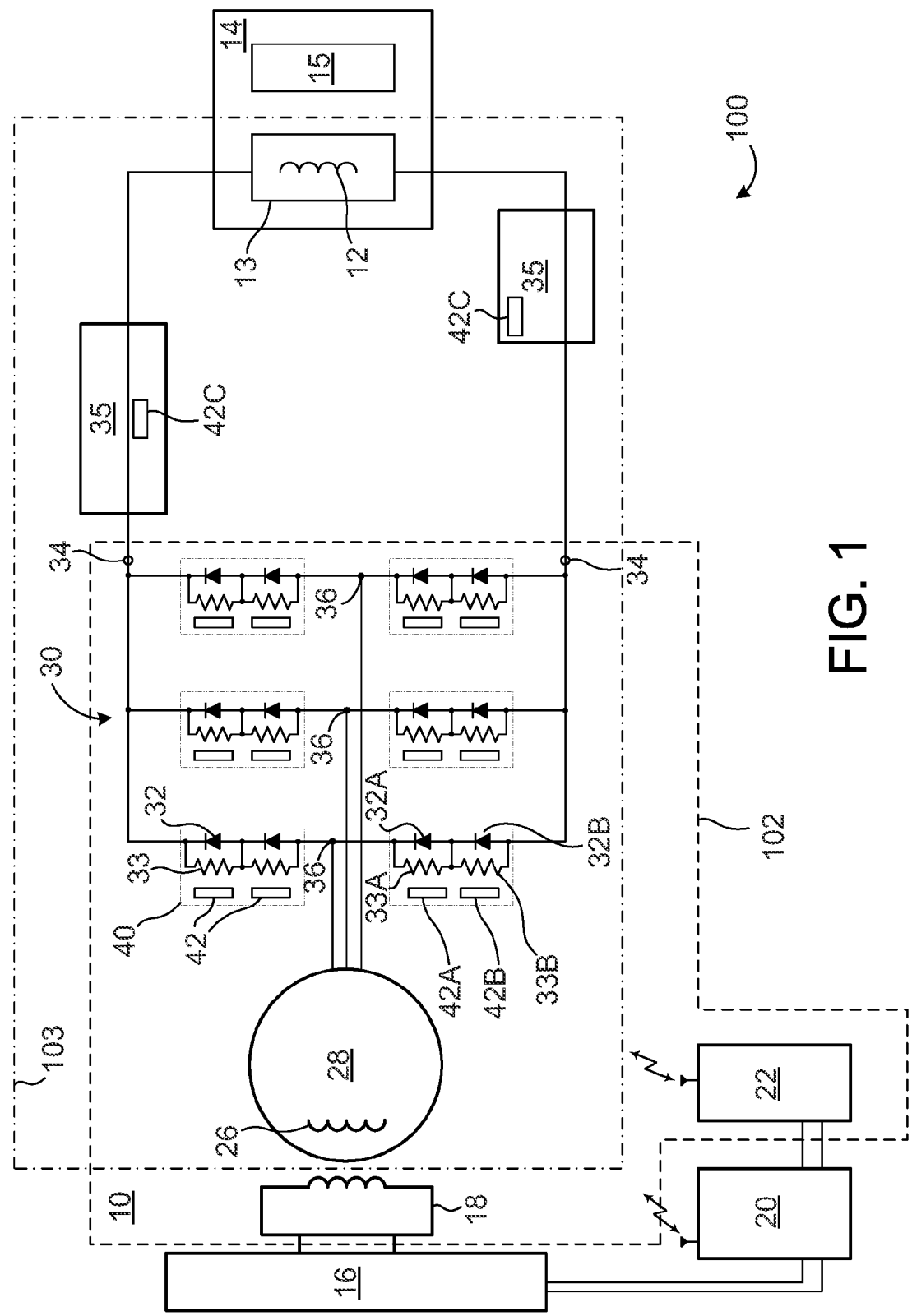
FIG. 1 is a schematic diagram of a circuit for a brushless excitation system, according to an aspect of the present invention.

FIG. 1 is a schematic view of an exemplary electrical machine 100 including generator brushless excitation system 10 for providing excitation power to the field coils 12 of the rotor 13 of an alternating current (AC) generator 14, such as a synchronous generator. The components of the brushless excitation system 10 are within the dotted line 102. The components within the dotted line 103 rotate with the rotor 13 of the generator 14.

The AC generator 14 may be a three-phase synchronous generator providing electrical power for an electric power utility, such as by providing power at a frequency and current level suitable for an electric power grid serving homes, businesses and other facilities. As the rotor 13 turns, an electromagnetic field formed by the field coils or field windings 12 induces a current in the stator 15 of the generator. Alternatively, the brushless excitation system disclosed herein may be applied to an electrically-driven motor.

An electric power source 16 provides DC power to the brushless exciter field 18. The power source 16 may be a permanent magnet generator (PMG) generating electrical alternating current (AC) power or a transformer connected to an alternate source of AC power. The AC power from the power source 16 is rectified in the controller 20, providing DC power to the brushless exciter field winding 18. The exciter field applies the magnetic flux to an armature 26 of the brushless excitation system 10. The power source 16 may be controlled and monitored by the controller 20, such as a programmable logic controller (PLC), microcontroller, excitation regulator or computer. The controller 20 monitors the condition of the brushless excitation system, analyzes data regarding the condition of the system and generates reports, notifications and/or alarms regarding the condition of the system 10.

The receiver 22 collects data from the rotating components of the brushless excitation system 10, such as by a slip ring in contact with the rotor 13 or wireless transmitters 42 attached to the rotor. The wireless transmitter may send infrared, radio frequency or other types of wireless signals with data regarding the condition of the brushless excitation system 10. The sensor also transmits an identifier via a RFID device with the data field of the sensing device. This will be referred to as a RFID Sensing Tag.

The exciter field coils 18 of the brushless excitation system 10 are electromagnetically coupled to coils of the armature 26 for the brushless excitation system 10. The coils of the armature are mounted on a rotor 28, which may be attached to an end of the rotor 13 in generator 14. AC current is induced by the exciter field winding 18 in the exciter coils of the armature 26. The AC power from the exciter field coils in armature 26 is applied to an electric current diode rectifier 30. The AC power is converted to DC power by the diode rectifier 30. The DC power from the diode rectifier 30 is applied to the rotor field coils 12 of the rotor 13 for the generator 14.

The diode rectifier 30 may include an array or plurality of diodes 32 for each phase of the AC current, e.g., three current phases, from the exciter rotor armature coils 26. The diodes may be arranged on a diode wheel. The output terminals 34 of the diode rectifier 30 apply DC power to connector leads 35 that are coupled to the rotor field coils 12. The input terminals 36 to the diode rectifier are connected to the coils of the armature to receive AC power. The diodes 32 in each array allow current to flow in one direction and thereby convert the alternating current to direct current. The diodes 32 are arranged in series. Alternating current at the input terminals 36 flows in a single direction through the diodes 32.

The diodes 32 ensure that direct current is applied to the rotor field coils or windings 12. Two or more diodes are preferably connected in series to provide redundancies in the rectifier. If one or more the diodes 32 fail in each array of diodes, the rectification of the alternating current may be fully performed by the redundant diode in the array. The failure of a single diode 32 may not substantially impair the conversion of AC to DC because the other diode in series with the failed diode can perform the rectification. If both diodes in a series fail, the conversion of that phase will fail. If two or more diodes in the array fail, alternating current may flow through the failed diodes and be applied to the rotor field coils 12. Alternating current applied to the rotor field windings will interfere with the formation of the electromagnetic fields by the rotor, reduce the power generation efficiency of the generator 14 and typically causes the generator to shut down.

The blocking or reverse voltage amplitude across each of the diodes 32 may be relatively large, typically between 40 and 500 volts. In some applications or conditions this voltage could be up to 1000 Volts or more.

The addition of a high ohmic, high voltage resistor 33 in parallel to the diode 32, adjacent and in proximity of a resistance temperature detecting (RTD) device or wireless temperature sensors 42 will generate a discernable temperature above ambient representing a normal operating condition. The addition of this parallel resistor 33 amplifies thermal characteristics of diode 32 operation or failure. While the diode 32 is in a forward operating condition, the voltage drop is small generating almost no heat. When the diodes 32 are blocking, the blocked potential will pass through the resistors 33 generating heat. With two diodes 32 in series and one of the diodes in a failed, shorted condition the blocking potential will generate little heat while the resistor 33 in parallel with the functional diode will produce nearly twice the heat then in a normal condition. Using a comparison algorithm on the diode-resistor array one can determine an error in a diode connection, a diode failed short or a resistor failed open. Resistor 33—wireless temperature sensor 42 pairs can be mounted or isolated in such a manner that the wireless temperature sensor 42 will sense a discernable temperature with the resistor to minimize the power dissipated. For example, the wireless temperature sensors 42, resistors 33 and diodes 32 can be mounted in or on a heat sink 40, so that the wireless temperature sensors are in thermal communication with the resistors 33.

The temperature of each resistor 33 indicates whether the diode 32 has failed. A diode failure in a brushless excitation system almost always results in a short, or nearly short, circuit in the diode. The resistor connected in parallel with a failed diode will experience reduced current flow and reduced temperature, when compared to resistors connected across functional diodes. Likewise the companion resistor, across the functional diode in a diode module pair with one failed diode, will dissipate nearly twice the energy (resulting in increased temperature) of a resistor in a normal operating state.

A wireless temperature sensor 42 is positioned near each resistor 33 and, preferably, is thermally isolated with the resistor. The wireless temperature sensors 42, such as resistance temperature detectors (RTDs), generate an output signal indicative of the operating temperature of the adjacent resistor(s) 33. The wireless temperature sensors 42 may also be comprised of a radio frequency identification (RFID) tag.

Electronic RFID devices are commercially available and do not per se embody the entire invention. Early RFID systems were developed utilizing relatively large packages, which limited the products on which they could be used. More recently, RFID devices have been made smaller so that they may be readily incorporated in tags or labels and their use can be more widespread. Such electronic devices are characterized in that they are thin, flat and generally small devices.

As one of ordinary skill in the art will appreciate, RFID tags may be characterized as "active" or "passive". Active RFID tags use internal batteries to power their circuits. An active tag also uses its battery to broadcast radio waves to a reader. Active tags generally broadcast high frequencies from about 860 to about 990 MHz that can be read about 100 feet or more away. Passive RFID tags rely entirely on the reader as their power source. These tags may be read up to 20 feet away, and they have lower production costs. In general, either tag works in the same way in that, data stored within an RFID tag's microchip waits to be read, the tag's antenna receives electromagnetic energy from a RFID reader's antenna, power is used from its internal battery (in the case of active tags), or power is harvested from the reader's electromagnetic field (in the case of passive tags), the tag sends radio waves back to the reader, and the reader picks up the tag's radio waves and interprets the signals over carrier frequencies as meaningful data.

Aspects of the present invention propose to integrate RFID transponder technology into the diode rectifier of an electrical machine, such as a generator or motor, to make it possible to transfer data wirelessly from the diode rectifier to a nearby location. The nearby location may be a location on the surrounding generator/motor casing without any requirement for power input to the transponder, or the location may be a controller 20 or wireless transmitter/receiver 22.

Figure 2:
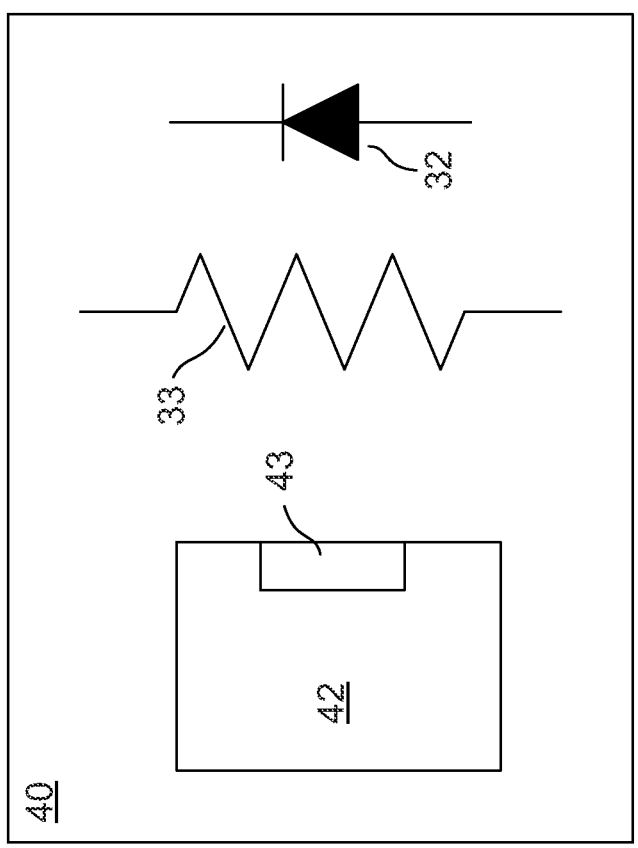
FIG. 2 is a schematic diagram of a diode, resistor and wireless temperature sensor mounted on a heat sink, according to an aspect of the present invention.

Referring to FIG. 2, the temperature signals from the temperature sensors 43 can be transmitted wirelessly by wireless temperature sensor 42, which may be an RFID tag or device. The wireless temperature sensor/RFID tag 42 (or 42A, 42B, 42C) transmits the temperature signals to controller 20 and/or receiver-transmitter 22. The wireless temperature sensor 42 with temperature sensor 43 is located on the heat sink 40 to be in thermal communication with the resistor 33 and/or the diode 32.

To detect a failed diode 32, the controller 20 monitors the temperature signals from each of the wireless temperature sensors 42. The temperature signals are indicative of the temperature of the resistor adjacent to the sensor and the operating environment. When the controller detects that the temperature of a resistor has fallen or risen above a predetermined or comparison threshold, the controller determines that the diode has failed. The controller may issue an alarm or a report identifying the failed diode. The controller may also indicate which diode has failed and/or the temperature sensor issuing a low or high diode parallel resistor temperature signal.

To determine whether a temperature signal from a wireless temperature sensor 42 indicates a failed diode, the controller 20 compares the signal to the temperature signals from the other wireless temperature sensors 42. The comparison may include calculating an average of all of the temperature signals from all wireless temperature sensors 42 in the diode rectifier 30, and checking for signals that are above or below the average by more than a threshold amount, such as by more than about 5 degrees Celsius below the average temperature signal. The average temperature signal may be determined over a recent period of time, such as an average of all temperature signals over a period of the last minute. In addition, the controller may compare the temperatures of each resistor in a series of diodes for one of the AC phases. If one of the resistors in a series is at a substantially lower or higher temperature, e.g., higher or lower by about 5 degrees Celsius, the controller 20 determines that the appropriate diode has failed. Accordingly, temperature differentials lower or higher than 5 degrees Celsius may also be employed, as desired in the specific application.

As non-limiting examples only and referring back to FIG. 1, if diode 32A fails by shorting while diode 32B remains functional, then resistor 33A will experience a reduced current flow when compared to resistor 33B. As a result, resistor 33A will be "cooler" compared to resistor 33B. A relatively "hotter" resistor 33B could indicate a failed diode 32A. Similarly, a relatively "cooler" resistor 33A could indicate a failed diode 32A.

Further, the direct current and power generated by the brushless excitation system may be determined by a wireless sensor 42C located on or near each of the connector leads 35 extending between the diode rectifier 30 and the field windings 12 of the rotor. The wireless sensor 42C may be a temperature sensor, e.g., a RTD, or an RFID tag including a temperature sensor. The resistance of each of the connector leads is a function of the temperature of the lead. By measuring the temperature of the connector lead, the resistance of the connector lead can be reliably determined.

The current in the connector lead can be determined by sensing the voltage potential across the lead connector 35 and calculating the resistance of the lead connector. The voltage potential of the connector may be measured by determining the difference of the voltage potential at electrical contact points (not shown). The wireless sensor or RFID sensor 42C transmits the voltage difference between the two points on the lead connector to the controller 20. Using Ohm's law, it is known that the voltage equals the product of the current and resistance. The controller may determine the current in the lead controller by dividing the voltage difference across the connector by the resistance between two points on the connector to which the electrical contacts are connected.

The wireless temperature sensors 42 are applied to detect faults in the diode rectifier. Detection of diode faults provides a technical effect of reporting when the diode rectifier in a brushless excitation system is in need of repair, before the system entirely fails to generate sufficient DC power for the rotor field windings. For example, the detection of a single diode failure in a diode array provides an indication of a needed repair. The failure of a single diode in a diode array may not cause the entire diode rectifier to fail. However, the failure of two or more diodes in series in a diode array may result in the failure of the diode rectifier. Having an indication that a single diode has failed, provides the operator of the brushless excitation system notification that a repair is needed, such as during the next scheduled shut down of the generator. The prompt repair of a single failed diode reduces the risk that the entire diode rectifier will fail and cause an unscheduled shut down of the generator.

Temperature sensors are applied to determine the direct current in each of the lead connectors. According to aspects of the present invention, the temperature sensors may also take the form of a wireless temperature sensor with voltage inputs or an RFID tag, which wirelessly transmits data back to controller 20. A real time reading of the direct current from the brushless excitation system provides an indication to the controller and the operator of the generator of the operating condition of the rotor field windings and of the generator.

Figure 3:
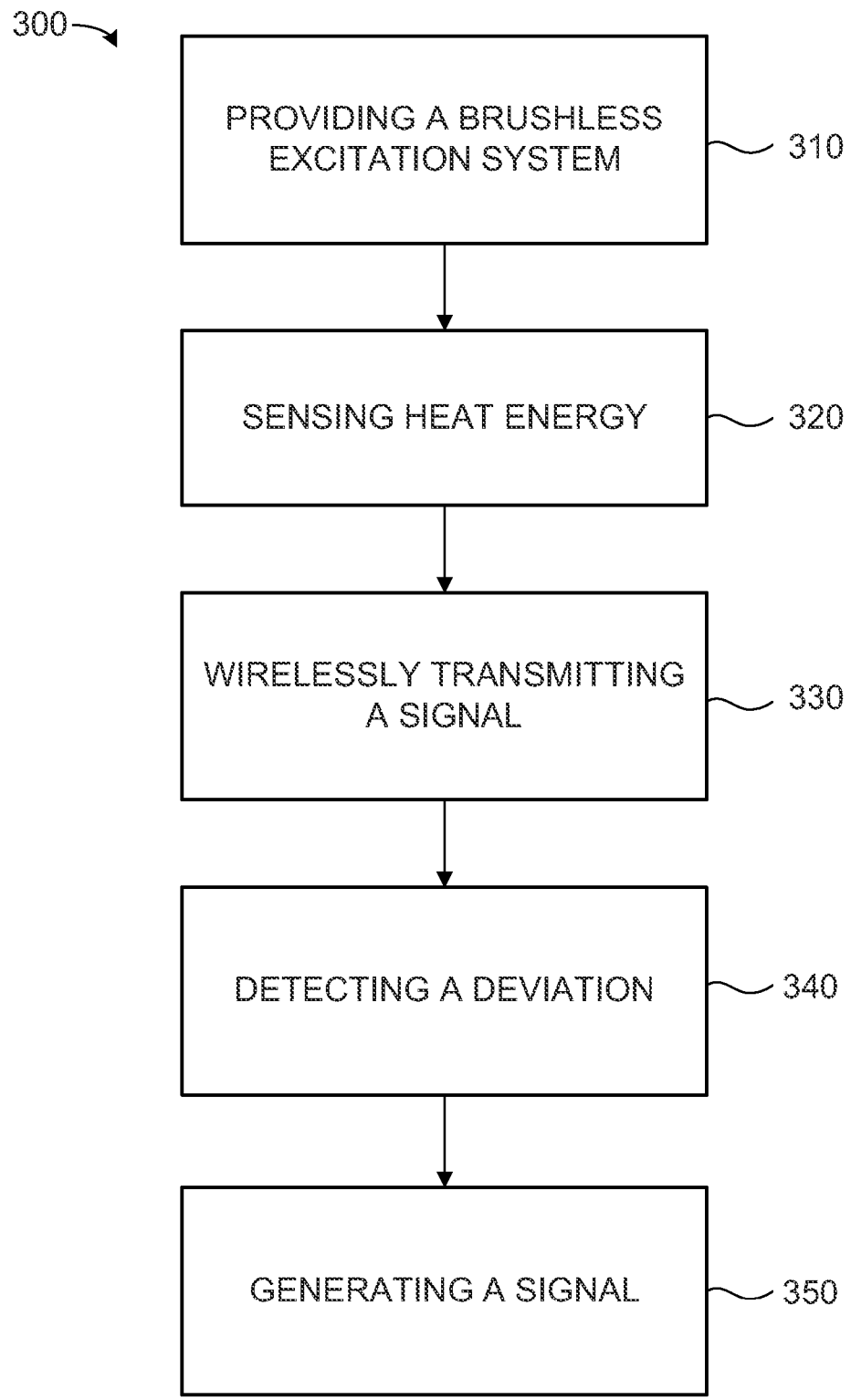
FIG. 3 is a flowchart of a method of operating an electrical machine, according to an aspect of the present invention.

FIG. 3 is a flowchart illustrating a method 300 of operating an electrical machine, according to an aspect of the present invention. The method 300 includes the steps of providing a brushless excitation system 310 including a diode rectifier having at least one diode, sensing heat energy 320 generated by at least one resistor connected in parallel with the at least one diode, wirelessly transmitting a signal 330 representative of the heat energy, detecting a deviation 340 of generated heat energy from the resistor, and generating a signal 350 indicating an error if the deviation in generated heat energy exceeds a predetermined threshold. The sensing heat energy step 320 may also include providing a temperature sensor 43 proximate to the resistor 33, and/or sensing a temperature with the temperature sensor. The transmitting step 330 may also include transmitting from an RFID tag 42 or 42C. The method 300 may also include the step of providing a temperature sensor in thermal communication with a heat sink 40, and/or providing the heat sink 40 to be in thermal communication with the resistor 33.

The method 300 may also include the steps of providing a plurality of diodes and a plurality of resistors, sensing heat energy and/or temperature from each of the plurality of resistors, and detecting a deviation in the heat energy of one of the plurality of resistors from an average of the heat energy of the plurality of resistors. A further step can be used for detecting the deviation by comparing the heat energy or temperature from one of the resistors to an amount of heat energy generated by at least one other resistor in the plurality of resistors. Another step can be used for providing an array of diodes where one resistor is connected in parallel with one diode, and where sensing heat energy or temperature further comprises sensing heat energy from each of the resistors in the array of diodes, and the deviation comprises a deviation of the heat energy or temperature from one resistor in the array of diodes as compared to at least one of the other resistors in the array of diodes.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of operating an electrical machine comprising:
   providing a brushless excitation system including a diode rectifier having at least one diode;
   sensing heat energy generated by at least one resistor connected in parallel with the at least one diode;
   wirelessly transmitting a signal representative of the heat energy;
   detecting a deviation of generated heat energy from the at least one resistor, and
   generating a signal indicating an error if the deviation in generated heat energy exceeds a predetermined threshold.

2. The method of claim 1, wherein sensing heat energy further comprises providing a temperature sensor proximate to the at least one resistor.

3. The method of claim 2, wherein sensing heat energy further comprises sensing a temperature.

4. The method of claim 2, wherein wirelessly transmitting further comprises:
   transmitting from an RFID tag.

5. The method of claim 3, further comprising:
   providing the temperature sensor in thermal communication with a heat sink, and providing the heat sink in thermal communication with the at least one resistor.

6. The method of claim 1, wherein providing a brushless excitation system further comprises:
   providing a plurality of diodes and a plurality of resistors;
   sensing heat energy from each of the plurality of resistors, and detecting a deviation in the heat energy of one of the plurality of resistors from an average of the heat energy of the plurality of resistors.

7. The method of claim 6, wherein sensing heat energy from each of the plurality of resistors further comprises sensing a temperature.

8. The method of claim 6, further comprising:
   detecting the deviation by comparing the heat energy from one of the plurality of resistors to an amount of heat energy generated by at least one other resistor in the plurality of resistors.

9. The method of claim 1, wherein providing a brushless excitation system further comprises:
   providing an array of diodes where one resistor is connected in parallel with one diode, and wherein sensing heat energy further comprises sensing heat energy from each of the resistors in the array of diodes, and the deviation comprises a deviation of the heat energy from one resistor in the array of diodes as compared to at least one of the other resistors in the array of diodes.

10. The method of claim 9, wherein sensing heat further comprises sensing a temperature.

11. A brushless excitation system for an electrical machine comprising:
    a diode rectifier configured to be electrically coupled to a source of alternating current, the diode rectifier having a plurality of diodes configured to produce direct current applied to field windings of a rotor of the electrical machine;
    a plurality of resistors, a resistor in the plurality of resistors connected in parallel with a diode in the diode rectifier;
    a plurality of wireless temperature sensors proximate to the plurality of resistors, wherein one wireless temperature sensor of the plurality of wireless temperature sensors is configured to sense temperature from one resistor in the plurality of resistors; and
    a controller receiving temperature data indicative of temperature signals from the plurality of resistors, wherein the controller detects whether one or more diodes in the diode rectifier is faulty based on the temperature data.

12. The brushless excitation system of claim 11, wherein the controller is configured to detect a faulty diode by identifying, from the temperature data, the resistor that is operating at a lower temperature than other resistors in the plurality of resistors.

13. The brushless excitation system of claim 11, wherein the plurality of wireless temperature sensors are resistance temperature detectors.

14. The brushless excitation system of claim 11, wherein the plurality of wireless temperature sensors are RFID tags.

15. The brushless excitation system of claim 11, wherein the plurality of wireless temperature sensors and the plurality of resistors are in thermal communication with one or more heat sinks.

16. The brushless excitation system of claim 15, wherein each of the plurality of wireless temperature sensors are adjacent to each of the plurality of resistors.

17. The brushless excitation system of claim 11, wherein the plurality of diodes, the plurality of wireless temperature sensors and the plurality of resistors are in thermal communication with one or more heat sinks.

18. The brushless excitation system of claim 17, wherein each of the plurality of diodes and each of the plurality of wireless temperature sensors are adjacent to each of the plurality of resistors.

19. The brushless excitation system of claim 11, wherein the controller detects a deviation in heat energy of at least one of the plurality of resistors from an average of heat energy of the plurality of resistors.

20. The brushless excitation system of claim 11, wherein the controller detects a deviation in temperature of at least one of the plurality of resistors from an average temperature of the plurality of resistors.

* * * * *